United States Patent
Kuhn et al.

(10) Patent No.: US 7,307,895 B2
(45) Date of Patent: Dec. 11, 2007

(54) SELF TEST FOR THE PHASE ANGLE OF THE DATA READ CLOCK SIGNAL DQS

(75) Inventors: Justus Kuhn, München (DE); Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 40 days.

(21) Appl. No.: 11/227,714

(22) Filed: Sep. 15, 2005

(65) Prior Publication Data

US 2006/0064620 A1 Mar. 23, 2006

(30) Foreign Application Priority Data

Sep. 15, 2004 (DE) .................. 10 2004 044 721

(51) Int. Cl.
*G11C 7/00* (2006.01)
(52) U.S. Cl. .................. 365/189.07; 365/233; 365/201
(58) Field of Classification Search ........... 365/189.07, 365/233, 201
See application file for complete search history.

(56) References Cited

U.S. PATENT DOCUMENTS 6,069,508 A 5/2000 Takai 6,667,913 B2 * 12/2003 Okuda et al. .......... 365/189.07

FOREIGN PATENT DOCUMENTS

DE 198 25 986 A1 12/1998

* cited by examiner

*Primary Examiner*—Huan Hoang
(74) *Attorney, Agent, or Firm*—Patterson & Sheridan, L.L.P.

(57) ABSTRACT

The invention relates to a semiconductor memory apparatus having at least one clock input contact for inputting an external clock signal, at least one clock output contact for outputting a data read clock signal for reading data stored in the semiconductor memory apparatus, at least one data contact for outputting data stored in the semiconductor memory apparatus, at least one phase adjustment device which is designed for approximately adjusting a phase of the data read clock signal on the basis of a phase of the external clock signal at least one phase difference test device which is designed for approximately detecting a phase difference between the phase of the data read clock signal and the phase of the external clock signal and for outputting a test result on the basis of the detected phase difference.

27 Claims, 1 Drawing Sheet

SELF TEST FOR THE PHASE ANGLE OF THE DATA READ CLOCK SIGNAL DQS

CROSS-REFERENCE TO RELATED APPLICATIONS

This application claims foreign priority benefits under 35 U.S.C. §119 to co-pending German patent application number DE 10 2004 044 721.7, filed 15 Sep. 2004. This related patent application is herein incorporated by reference in its entirety.

BACKGROUND OF THE INVENTION

1. Field of the Invention

The invention relates to a semiconductor memory apparatus.

2. Description of the Related Art

Semiconductor memory apparatuses in which stored data are read out at double data rate relative to an external, incoming clock signal are now widely used, particularly for high speed applications. In such "DDR-DRAMs", the phase or timing of the output data DQ is specified by a data read clock signal, which is conventionally called the DQS signal.

In this context, the phase of the data read clock signal DQS has its phase angle adjusted in relation to the input, external clock signal CLK using a phase adjustment device. The phase adjustment device is often a "DLL" (Delay Locked Loop) circuit which feeds a "clock tree" for supplying the semiconductor memory apparatus with an internal clock signal.

The phase angle of the data read clock signal DQS is subject to numerous different interfering effects which means that in some cases it does not match the nominally desired phase angle. For example, although the phase adjustment device, i.e., the DLL circuit, can compensate for slow variations in internal delays in the DLL circuit, brief fluctuations caused by voltage fluctuations, for example, cannot be equalized by the phase adjustment device.

The actual phase angle of the data read clock signal DQS in a DDR-DRAM therefore needs to be tested as part of a test in a semiconductor memory apparatus. In addition, it is conventionally necessary for a test apparatus to detect the data DQ which are output from the semiconductor memory apparatus, taking into account the phase angle of the data read clock signal DQS, which is called "source synchronous sampling".

However, testing the actual phase angle of the data read clock signal DQS and detecting the output data DQ by means of a test taking into account the phase angle of the data read clock signal DQS require complex high speed test tools which—if they are actually available—result in high costs.

SUMMARY OF THE INVENTION

It is an object of the invention to specify a simplified way of checking the phase angle of the data read clock signal DQS for an external clock signal CLK.

In one embodiment of the invention, a semiconductor memory apparatus comprises at least one clock input contact for inputting an external clock signal (also called CLK signal); at least one clock output contact for outputting a data read clock signal (also called DQS signal) for reading data stored in the semiconductor memory apparatus; at least one data contact for outputting data stored in the semiconductor memory apparatus (also called DQ signal); at least one phase adjustment device (also called DLL circuit) which is designed for approximately adjusting a phase of the data read clock signal (DQS) on the basis of a phase of the external clock signal (CLK); and at least one phase difference test device which is designed for approximately detecting a phase difference between the phase of the data read clock signal (DQS) and the phase of the external clock signal (CLK) and for outputting a test result on the basis of the detected phase difference.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
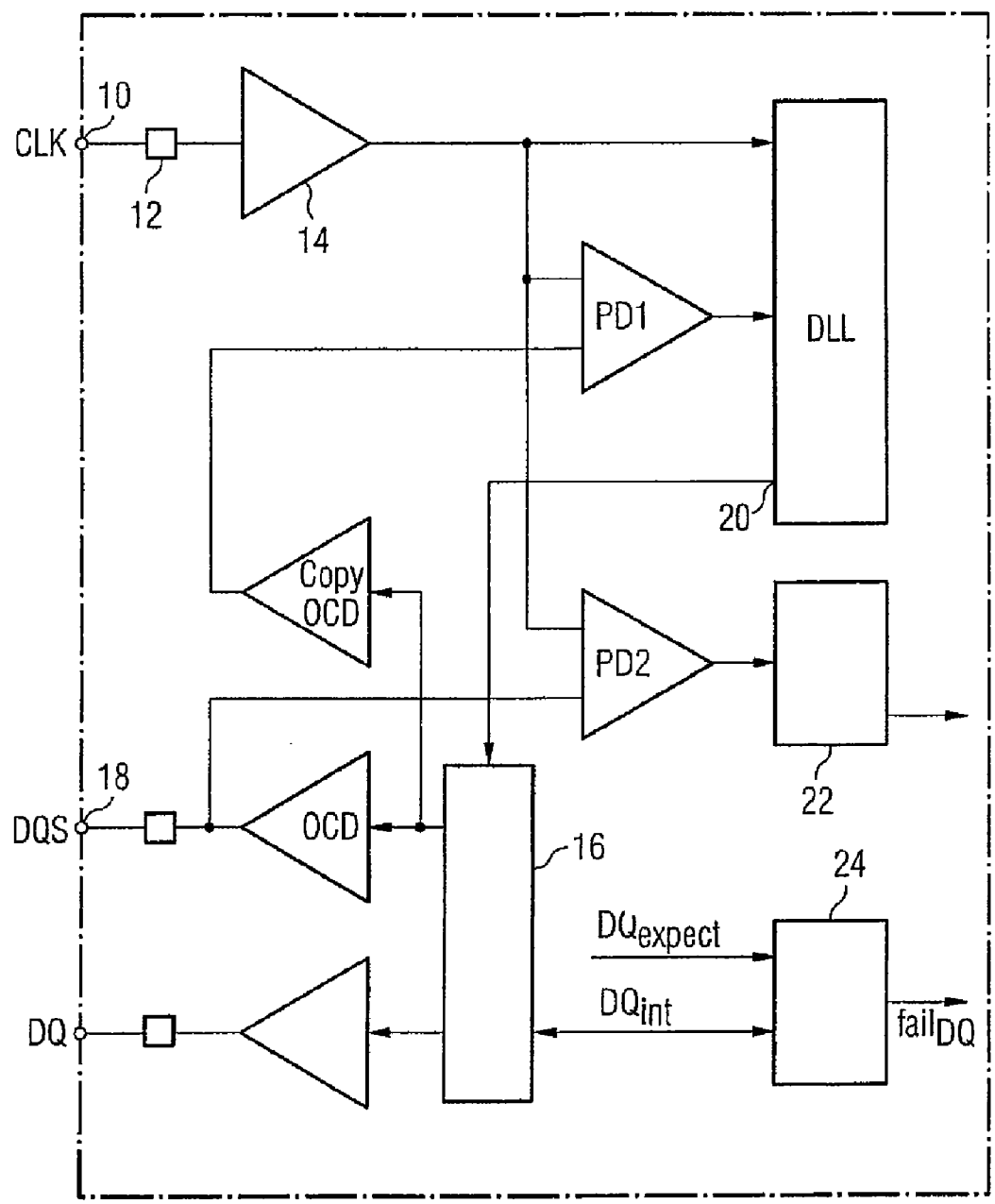
FIG. 1 shows a schematic block diagram of a preferred embodiment of a semiconductor memory apparatus based on the invention.

The inventive concept is based on a novel approach according to which a test device for the phase angle or the phase difference between the data read clock signal (DQS) and the external clock signal (CLK) is actually provided in the semiconductor memory apparatus, i.e., in the semiconductor chip. Hence, the invention implements a "read clock BIST" (read clock built in self test), which results in enormous simplifications and attendant savings with regard to external test tools for measuring the phase angle of the data read clock signal (DQS).

A semiconductor memory apparatus based on the invention comprises a phase difference test device which can at least approximately detect a phase difference or relative phase angle between the phase of the data read clock signal (DQS) and the phase of the external clock signal (CLK). Although the phase adjustment device (DLL) means that there should be a control mechanism for the "clock tree" in order to readjust the timing of fluctuations in time delays particularly in the phase adjustment device (DLL), rapid fluctuations, which are also called "jitter", cannot be equalized quickly enough by the phase adjustment device (DLL). This results—besides further interfering influences—in unwanted discrepancies between the data read clock signal (DQS) and the external clock signal (CLK), which puts the operability of the semiconductor memory apparatus at risk in the extreme case.

The phase difference test device in the form of a BIST (built in self test) thus allows detection of the phase difference between the DQS signal and the CLK signal. It should be remembered that although the data read clock signal (DQS) and the external clock signal (CLK) are generally at the same frequency, the data read clock signal (DQS) is clocked only during reading. The external clock signal (CLK) is generally a continuous clock signal.

By providing an internal phase difference test device which is arranged in the semiconductor memory apparatus itself, there is now no need for external detection of the data read clock signal (DQS) relative to the external clock signal (CLK), which means that it is not necessary to measure any high speed signals, particularly signals at the double data rate ("DDR"), when testing the DRAM.

In one preferred embodiment, the phase difference test device comprises a phase detector (PD1) for the phase adjustment device (DLL), the first detector input of said phase detector being connected for signaling purposes to a receiver output of a clock signal receiver for the external clock signal (CLK), and the second detector input of said phase detector being connected for signaling purposes to a driver output of a dummy output driver (Copy-OCD), with a driver input of the dummy output driver being connected for signaling purposes to a driver input of an output driver (OCD) for the data read clock signal (DQS).

This stated embodiment is a particularly simple way of implementing the present invention which is also inexpensive to realize. To implement the "built in self test" for the phase angle of the data read clock signal (DQS), this embodiment resorts to a phase detector (PD1) which is also already provided in the case of conventional semiconductor memory apparatuses with phase adjustment devices (DLL circuits). Such a phase detector (PD1) compares the phases of two input signals and outputs a control signal to the phase adjustment device (DLL) on the basis of the detected phase difference. The first input signal for the phase detector (PD1) is a receiver output signal from a clock signal receiver which is arranged at the output of the clock input contact. The clock signal receiver for the external clock signal (CLK) inevitably has a certain receiver delay. The second input signal for the phase detector (PD1) is an output signal from a dummy output driver (copy-OCD). The dummy output driver is a replica or copy of the "actual" output driver OCD (on-chip driver), which is provided for outputting the data read clock signal (DQS) from an output register. In order to be better able to take account of time fluctuations or variations on account of interfering influences on the output driver (OCD), the data read clock signal (DQS) is tapped off upstream of the output driver (OCD) and is supplied to the phase detector (PD1) via the dummy output driver (copy-OCD).

Possibly in a special test mode which can be activated externally, this phase detector (PD1) may thus be designed to output a test result on the basis of the detected phase difference between the two input signals and not just to supply it to the phase adjustment device (DLL).

In one particularly preferred embodiment of the present invention, the phase difference test device comprises a phase detector (PD2) whose first detector input is connected for signaling purposes to a receiver output of a clock signal receiver for the external clock signal (CLK) and whose second detector input is connected for signaling purposes to a driver output of an output driver (OCD) for the data read clock signal (DQS).

This particularly preferred embodiment permits a more exact comparison of the relative phase angle of the data read clock signal (DQS) in relation to the external clock signal (CLK), since the "actual" output driver (OCD)—and not a copy thereof, as in the previous embodiment—is used. Preferably, the semiconductor memory apparatus is switched to a special test mode for test purposes. Possibly with suitable termination of the clock output contact on the chip itself ("on-die termination"), the driver output of the output driver (OCD) for the data read clock signal (DQS) is supplied to a phase detector (PD2) which is provided in addition to the aforementioned phase detector (PD1). The second input of the phase detector (PD2) is in turn connected to the receiver output of the clock signal receiver for the external clock signal (CLK). Inaccuracies in the check on the relative phase angle of the data read clock signal (DQS) as a result of discrepancies between a dummy output driver (Copy-OCD) and the "actual" output driver (OCD) can thus be prevented completely.

In a further preferred embodiment, the test signal is between a minimum value and a maximum value of the detected phase differences during a predetermined test period. Preferably, in a special test mode of the semiconductor memory apparatus, the minimum and maximum detected phase differences between the (approximate) phase of the data read clock signal (DQS) and the phase of the external clock signal (CLK) are detected as a test result in a test period which can be predetermined in the semiconductor memory apparatus or can be input externally. This test result is preferably temporarily stored in a buffer-store and can be read in the test mode of the semiconductor memory apparatus.

In a further preferred embodiment, the test result is a frequency distribution for the detected phase differences in a multiplicity of phase difference ranges. The test result may therefore be a "histogram data record", on the basis of which the phase difference test device is designed to determine the frequency of occurrence of detected phase differences in predetermined or predeterminable phase difference ranges. Such a histogram data record may be of benefit for more accurate analysis of phase angle fluctuations in the data read clock signal (DQS) relative to the external clock signal (CLK).

In a further preferred embodiment, the test signal is a binary test signal which assumes a first value when the detected phase differences are not below or above a predetermined phase difference value in a predetermined test period and which assumes a second value when the detected phase differences are below or above the predetermined phase difference value in a predetermined test period.

In this embodiment, the phase difference test device is designed to output a test signal in the form of a binary "fail/pass signal". The binary test result signal is output as a "pass signal" (i.e., the semiconductor memory apparatus meets the requirements) if, within a test period which is predetermined in the semiconductor memory apparatus or which can be input externally, the detected phase differences between the phase of the data read clock signal (DQS) and the phase of the external clock signal (CLK) are, in particular, not above a certain, predetermined or predeterminable limit value. Otherwise, a "fail" signal is output.

In a further preferred embodiment, a semiconductor memory apparatus based on the invention also comprises a data test device which is designed for comparing data ($DQ_{int}$) which are to be output with data ($DQ_{expect}$) which are calculated in the semiconductor memory apparatus and for outputting a test result signal on the basis of the comparison. In this embodiment, the data ($DQ_{int}$) which are to be output are not tested externally, as is conventional, but rather internally by "on-chip test logic". In this context, it is assumed that the expected data ($DQ_{expect}$) which are to be output can be calculated in the semiconductor memory apparatus, which is often possible for relatively simple memory test patterns. In the case of this embodiment, there is thus no need to measure high speed clock or data signals externally.

In this context, it should be remembered that it is not possible to have a fixed phase relationship for detecting data which are to be output in the case of high speed circuits. By way of example, a 1 GHz DDR semiconductor memory actually produces a bit time of, in theory, 500 ps. This is because when a fixed phase relationship is used the output phase would need to be constant within this time window (reduced by the prescribed accuracy). The envisaged data test device may thus result in further significant simplification of the necessary external test tools, in particular. This practice presupposes that the phase difference between the data signal (DQ) and the data read clock signal (DQS) is small enough and no measurement or testing is necessary during manufacture.

Preferably, the semiconductor memory apparatus is a DRAM, particularly a DDR-DRAM.

The inventive embodiments may also be used for semiconductor memory apparatuses which have a nonconstant data read clock signal (DQS), for example a bidirectional or switched data read clock signal (DQS). In this connection, it is not necessary for the data read clock signal (DQS) to be switched to a "constant or continuous" output mode when a special test mode is being used. This is important particularly in those cases in which it is not clear to what extent the output signals are influenced by the use of the "constant or continuous" DQS mode.

FIG. 1 shows a schematic block diagram of a particularly preferred embodiment of a semiconductor memory apparatus based on the invention with not all components of the semiconductor memory apparatus being shown.

An external clock signal CLK is input into the semiconductor memory apparatus via an appropriate clock input contact 10. In the usual manner, the clock input contact 10, which is a "ball", has a "pad" 12 connected downstream of it which for its part has a signaling connection to a clock signal receiver 14. The receiver output of the clock signal receiver 14 is connected in conventional fashion to an input of the phase adjustment device DLL and also to a first input of a phase detector PD1. The second input of the phase detector PD1 is connected to a driver output of a dummy output driver Copy-OCD whose driver input is connected to a DQS output of an output register 16. The dummy output driver Copy-OCD is a copy or replica of an output driver OCD which outputs the data read clock signal DQS from the output register 16 to the clock output contact 18.

The phase adjustment device DLL has an output 20 for outputting an internal clock signal for actuating a "clock tree". The internal clock signal is output to the output register 16, in particular. Time fluctuations or variations in the delays of the phase adjustment device DLL can be equalized at least partly by the control loop comprising the phase detector PD1, since the output signal from PD1 is supplied as a control signal to the phase adjustment device DLL.

To be able to check the relative phase angle of the data read clock signal DQS with respect to the external clock signal CLK using a test implemented on the chip itself, the semiconductor memory apparatus shown in FIG. 1 has a phase difference test device which comprises a second phase detector PD2. The first input of the second phase detector PD2, which is provided in addition to the phase detector PD1 (which is also used conventionally), is connected to the receiver output of the clock signal receiver 14. The second detector input of the second phase detector PD2 is connected to the output of the actually used output driver OCD for the data read clock signal DQS, however. A phase difference is thus detected between the external clock signal CLK at the output of the associated clock signal receiver 14 and the data read clock signal at the output of the corresponding output driver OCD.

The output of the second phase detector PD2 is connected to a buffer 22 which can store and subsequently output the test result. By way of example, the buffer 22 may be a simple min/max memory which stores the maximum value and the minimum value of the detected phase differences between the two input signals from PD2 in a predetermined period.

It should be remembered that the phase which is measured by the second phase detector PD2 differs systematically from the externally observable phase by the sum of the propagation delay on the bonding wires for the external clock signal CLK and for the data read clock signal DQS.

The preferred embodiment of a semiconductor memory apparatus which is shown in FIG. 1 also has a data test device 24 as part of the phase difference test device. The data test device 24 is designed to compare data $DQ_{int}$ which are to be output with data $DQ_{expect}$ which are calculated in the semiconductor memory apparatus and to output a test result signal on the basis of the comparison. This practice presupposes that the phase difference between the output signal DQ and the data read clock signal DQS is small. It is also assumed that the expected output data $DQ_{expect}$ can be calculated internally, which is often the case for relatively simple memory test patterns. The output signal produced is a binary test result signal $fail_{DQ}$, for example, which possibly indicates a failed check on the data signal.

While the foregoing is directed to embodiments of the present invention, other and further embodiments of the invention may be devised without departing from the basic scope thereof, and the scope thereof is determined by the claims that follow.

What is claimed is:

1. A memory device, comprising:
   a clock input contact for inputting an external clock signal;
   a clock output contact for outputting a data read clock signal for reading data stored in the memory device;
   an external contact for outputting data from the memory device;
   a phase difference test device configured to:
   detect a phase difference between an adjusted phase of the data read clock signal and the phase of the external clock signal; the phase of the data read clock signal having been adjusted relative to a phase of the external clock signal; and
   output a test result on the external contact based on the detected phase difference.

2. The memory device of claim 1, further comprising:
   a phase adjustment device configured to adjust a phase of the data read clock signal on the basis of the phase of the external clock signal.

3. The memory device of claim 1, wherein the phase difference test device comprises:
   a first phase detector for the phase adjustment device, wherein a first input of the first phase detector is connected to an output of a clock signal receiver for the external clock signal and a second input of the first phase detector is connected to an output of a dummy output driver, wherein an input of the dummy output driver is connected to an input of an output driver for the data read clock signal.

4. The memory device of claim 3, wherein the phase difference test device further comprises:
   a second phase detector, wherein a first input of the second phase detector is connected to the output of the clock signal receiver for the external clock signal and a second input of the second phase detector is connected an output of the output driver for the data read clock signal.

5. The memory device of claim 1, wherein the test result comprises a minimum value and a maximum value of phase differences detected by the phase difference test device in a predetermined test period.

6. The memory device of claim 1, wherein the test result is a histogram of phase differences detected by the phase difference test device in a multiplicity of phase difference ranges.

7. The memory device of claim 1, wherein the test result is a binary test result signal, wherein the test result signal is a first value when the detected phase difference is within a predetermined phase range during a predetermined test period and wherein the test result is a second value when the detected phase difference is outside the predetermined phase range during the predetermined test period.

8. The memory device of claim 1, further comprising a data test device configured to:
 compare output data of the memory device with predicted data, wherein the predicted data is generated by the memory device; and
 output a test result signal based on the comparison.

9. A memory device, comprising:
 means for inputting an external clock signal;
 means for outputting a data read clock signal for reading data stored in the memory device;
 means for outputting data from the memory device;
 means for adjusting phase configured to adjust a phase of the data read clock signal on the basis of a phase of the external clock signal; and
 means for testing phase difference configured to:
 detect a phase difference between a phase of the data read clock signal and the phase of the external clock signal; and
 output a test result on the external contact based on the detected phase difference.

10. The memory device of claim 9, wherein the means for testing phase difference comprises:
 a first means for detecting phase for the means for adjusting phase, wherein a first input of the first means for detecting phase is connected to an output of a means for receiving the external clock signal and a second input of the first means for detecting phase is connected to an output of a dummy means for outputting, wherein an input of the dummy means for outputting is connected to an input of a means for outputting the data read clock signal.

11. The memory device of claim 10, wherein the means for testing phase difference further comprises:
 a second means for detecting phase, wherein a first input of the second means for detecting phase is connected to the output of the means for receiving the external clock signal and a second input of the second means for detecting phase is connected to an output of the means for outputting the data read clock signal.

12. The memory device of claim 9, wherein the test result comprises a minimum value and a maximum value of phase differences detected by the means for testing phase difference in a predetermined test period.

13. The memory device of claim 9, where the test result is a histogram of phase differences detected by the means for testing phase difference in a multiplicity of phase difference ranges.

14. The memory device of claim 9, where the test result is a binary test result signal, wherein the test result signal is a first value when the detected phase difference is within a predetermined phase range during a predetermined test period and wherein the test result is a second value when the detected phase difference is outside the predetermined phase range during the predetermined test period.

15. The memory device of claim 9, further comprising a data test device configured to:
 compare output data of the memory device will predicted data, wherein the predicted data is generated by the memory device; and
 output a test result signal based on the comparison.

16. A method for testing a memory device, comprising:
 receiving an external clock signal;
 adjusting a phase difference between the external clock signal and a data read clock signal;
 detecting the adjusted phase difference between the data read clock signal and the external clock signal; and
 outputting a test result on an external contact of the memory device based on the detected phase difference.

17. The method of claim 16, wherein the phase difference is adjusted using a first data read clock signal output by a dummy output driver of the semiconductor and wherein an input of the dummy output driver is connected to an input of an output driver for a second data read clock signal.

18. The method of claim 17, wherein the detected phase difference is a phase difference between the external clock signal and the second data read clock signal.

19. The method of claim 16, further comprising:
 performing a test of the memory device for a predetermined test period, wherein the test result comprises a minimum value and a maximum value of phase differences detected during the predetermined test period.

20. The method of claim 16, further comprising:
 performing a test of the memory device for a predetermined test period, wherein the test result is a histogram of phase differences detected in a multiplicity of phase difference ranges during the predetermined test period.

21. The method of claim 16, further comprising:
 performing a test of the memory device for a predetermined test period to produce the test result in the form of a binary test result signal; wherein the test result signal is a first value when the detected phase difference is within a predetermined phase range during a predetermined test period and wherein the test result is a second value when the detected phase difference is outside the predetermined phase range during the predetermined test period.

22. The method of claim 16, further comprising:
 comparing output data of the memory device with predicted data, wherein the predicted data is generated by the memory device; and
 outputting a test result signal based on the comparison.

23. A memory device, comprising:
 an input for an external clock signal;
 an output for a data strobe signal;
 a first phase detector for detecting a phase difference between the external clock signal and the data strobe signal;
 a delay locked loop for adjusting a phase difference between the external clock signal and the data strobe signal;
 a second phase detector for detecting the adjusted phase difference between the external clock signal and the data strobe signal; and
 test circuitry configured to output the detected adjusted phase difference.

24. The memory device of claim 23, wherein the test circuitry outputs the detected phase difference when the memory device is placed in a test mode.

25. The memory device of claim 23, wherein the first phase detector uses a data strobe signal output by a dummy output driver, and wherein the second phase detector uses a data strobe signal output by an output driver.

26. The memory device of claim 23, further comprising:
a memory; and
wherein the test circuitry is further configured to:
conduct a test of the memory device for a test period; and
output a test result of the test to the memory after the test period.

27. The memory device of claim 26, wherein the test result comprises one of:
a maximum value and a minimum value of the detected phase difference during the test period;
a histogram of detected phase differences during the test period; and
a value indicating whether the detected phase difference was within a desired range during the test period.

* * * * *

UNITED STATES PATENT AND TRADEMARK OFFICE
CERTIFICATE OF CORRECTION

| | |
|---|---|
| PATENT NO. | : 7,307,895 B2 |
| APPLICATION NO. | : 11/227714 |
| DATED | : December 11, 2007 |
| INVENTOR(S) | : Justus Kuhn et al. |

It is certified that error appears in the above-identified patent and that said Letters Patent is hereby corrected as shown below:

In the Claims Section:

In Claim 15, at Column 8, Line 5, please delete "will" and insert --with--.

Signed and Sealed this

Nineteenth Day of August, 2008

JON W. DUDAS
*Director of the United States Patent and Trademark Office*